United States Patent
Carrara et al.

(10) Patent No.: US 9,628,028 B2
(45) Date of Patent: Apr. 18, 2017

(54) COMMON-MODE FEEDBACK CIRCUIT, CORRESPONDING SIGNAL PROCESSING CIRCUIT AND METHOD

(71) Applicant: STMICROELECTRONICS S.R.L., Agrate Brianza (IT)

(72) Inventors: Francesco Carrara, Acireale (IT); Felice Alberto Torrisi, Lentini (IT); Francesco Clerici, Aci Castello (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/746,124

(22) Filed: Jun. 22, 2015

(65) Prior Publication Data

US 2016/0072448 A1    Mar. 10, 2016

(30) Foreign Application Priority Data

Sep. 9, 2014  (IT) ............... TO2014A0703

(51) Int. Cl.
| | | |
|---|---|---|
| H03F 3/45 | (2006.01) | |
| H03F 1/08 | (2006.01) | |
| H03F 1/02 | (2006.01) | |

(52) U.S. Cl.
CPC ........... *H03F 1/086* (2013.01); *H03F 1/0205* (2013.01); *H03F 1/083* (2013.01); *H03F 3/45085* (2013.01); *H03F 3/45179* (2013.01); *H03F 3/45502* (2013.01); *H03F 3/45511* (2013.01); *H03F 2200/456* (2013.01); *H03F 2203/45008* (2013.01); *H03F 2203/45116* (2013.01);

(Continued)

(58) Field of Classification Search
CPC .............................. H03F 2003/4504

USPC ................... 330/253, 257–258, 311
See application file for complete search history.

(56) References Cited

U.S. PATENT DOCUMENTS

| | | | | |
|---|---|---|---|---|
| 5,298,809 A | * | 3/1994 | Yamaguchi | ......... H03F 3/45479 327/312 |
| 5,332,937 A | | 7/1994 | Castello et al. | |

(Continued)

FOREIGN PATENT DOCUMENTS

EP    0520751    12/1992

OTHER PUBLICATIONS

Sanchez-Sinencio et al.—Design of Continuous-Time Filters from 0.1 Hz to 2.0 GHz: Tutorial Noties, 2004 IEEE International Symposium on Circuits and Systems, ISCAS Nov. 2004, 69 pp.

(Continued)

*Primary Examiner* — Khanh V Nguyen
*Assistant Examiner* — Khiem Nguyen
(74) *Attorney, Agent, or Firm* — Slater Matsil, LLP (57) ABSTRACT

A common-mode feedback circuit includes a transconductor input stage with differential input terminals, and a frequency-compensated gain stage coupled to the transconductor input stage with differential output terminals. The common-mode feedback circuit also includes a feedback loop having a comparator configured to produce a feedback error signal for the transconductor input stage by comparing with a reference a common-mode sensing signal indicative of a common-mode voltage level sensed at the differential output terminals. In addition, the common-mode feedback loop includes a converter for converting the common-mode voltage level sensed at said differential output terminals into a current signal coupled to the comparator.

16 Claims, 5 Drawing Sheets

(52) U.S. Cl.
CPC .............. *H03F 2203/45418* (2013.01); *H03F 2203/45424* (2013.01); *H03F 2203/45431* (2013.01)

(56) References Cited

U.S. PATENT DOCUMENTS

| | | |
|---|---|---|
| 5,933,056 A | 8/1999 | Rothenberg |
| 6,362,682 B2 | 3/2002 | Shulman |
| 2005/0046481 A1 | 3/2005 | Van Engelen et al. |
| 2009/0195311 A1 | 8/2009 | Lawas et al. |

OTHER PUBLICATIONS

Castello et al. —A High-Linearity 50-Ω CMOS Differential Driver for ISDN Applications, IEEE Journal of Solid-State Circuits, vol. 26, No. 12, Dec. 1991, pp. 1809-1816.
Maxim Integrated Products, Inc.—MAX9626/MAX9627/MAX9628 Low-Noise, Low-Distortion, 1.35GHz Fully Differential Amplifiers, 2011, 20 pp. http://datasheets.maximintegrated.com/en/ds/MAX9626-MAX9628.pdf.
Lokere et al.—SiGe Differential Amplifier Drives High Speed ADCs at Hundreds of MHz, Linear Technology, Jun. 2007, vol. XVII, No. 2, 3 pp. http://cds.linear.com/docs/en/lt-journal/LTMag-V17N02-01-LTC6400-Lokere.pdf.
IBM Corp.—Accurate Biasing of Bipolar Differential Amplifiers with CMOS Feedback Circuitry, IBM Disclosure Bulletin, Thornwood U.S., vol. 38, No. 8, Aug. 1, 1995, 2 pp.

\* cited by examiner

COMMON-MODE FEEDBACK CIRCUIT, CORRESPONDING SIGNAL PROCESSING CIRCUIT AND METHOD

FIELD OF THE INVENTION

The present disclosure relates to a common-mode feedback circuit, corresponding signal circuit, and to a related method.

BACKGROUND

Operational amplifiers (opamps) are a useful and versatile building block in analog signal processing circuits. With progressively lower supply voltages, the opamp output signal swing may undergo severe limitations.

One possible approach to increase the output swing is to adopt a fully differential opamp topology, which also improves the supply noise/disturbance rejection. A fully differential structure may, however, involve an extra circuit, namely a common-mode feedback (CMFB) circuit to set the common-mode voltage at different high-impedance nodes that are not stabilized by the negative differential feedback.

SUMMARY

A common-mode feedback circuit includes a transconductor input stage with differential input terminals, and a frequency-compensated gain stage coupled to the transconductor input stage with differential output terminals. The common-mode feedback circuit also includes a feedback loop having a comparator configured to produce a feedback error signal for the transconductor input stage by comparing with a reference a common-mode sensing signal indicative of a common-mode voltage level sensed at the differential output terminals. In addition, the common-mode feedback loop includes a converter for converting the common-mode voltage level sensed at the differential output terminals into a current signal coupled to the comparator.

BRIEF DESCRIPTION OF THE DRAWINGS

One or more embodiments will now be described, purely by way of non-limiting example, with reference to the annexed figures, wherein.

DETAILED DESCRIPTION

In the ensuing description various specific details are illustrated, aimed at providing an in-depth understanding of various examples of embodiments of the invention. The embodiments may be obtained without one or more of the specific details, or with other methods, components, materials, etc. In other cases, known structures, materials, or operations are not illustrated or described in detail so that the various aspects of the embodiments will not be obscured.

Reference to "an embodiment" or "one embodiment" in the framework of the present description is intended to indicate that a particular configuration, structure, or characteristic described in relationship to the embodiment is comprised in at least one embodiment. Hence, phrases such as "in an embodiment" or "in one embodiment" that may be present in various points of the present description do not necessarily refer to one and the same embodiment. Moreover, particular conformations, structures, or characteristics may be combined in any adequate way in one or more embodiments.

Figure 3:
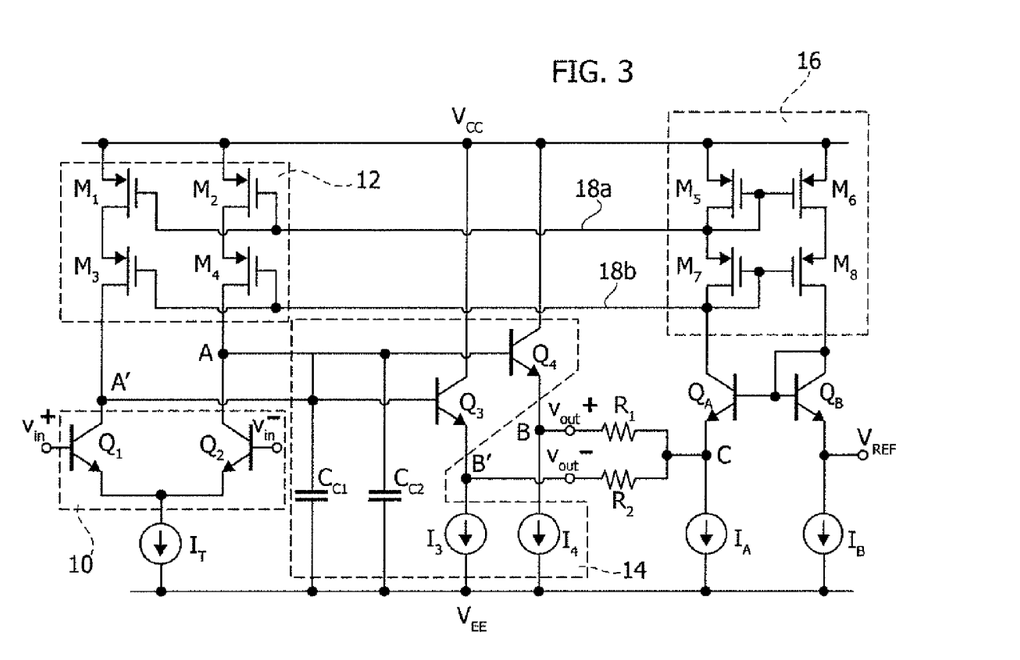
FIG. 3 is a circuit diagram exemplary of embodiments of the invention.

The foregoing applies, by way of non-limiting example, to the features shown in FIGS. 8 to 11, while shown as possibly applied to the circuit topology of FIG. 3, these features can be applied to any of the other circuit topologies exemplified herein.

The references used herein are provided merely for convenience and hence do not define the sphere of protection or the scope of the embodiments. In that respect it will be appreciated that identical or similar entities will be indicated by the same references throughout the figures, without repeating a corresponding description for each figure.

Figure 1:
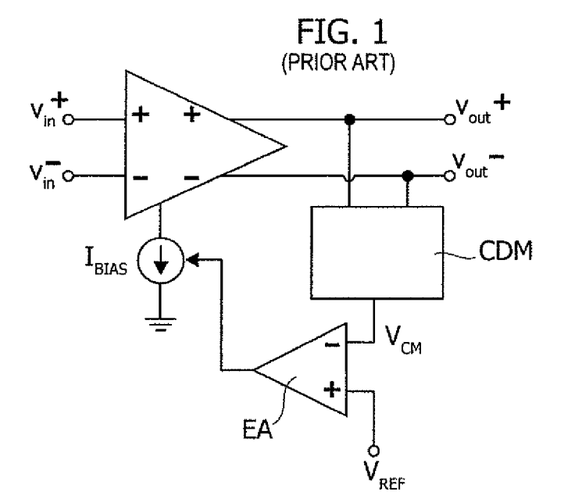
FIG. 1 is a basic diagram of a prior art common-mode feedback circuit.

FIG. 1 is a basic diagram of a common-mode feedback (CMFB) circuit as described, for example, in E. Sánchez-Sinencio and J. Silva-Martínez, "Design of continuous-time filters from 0.1 Hz to 2.0 GHz: Tutorial notes," in 2004 *IEEE International Symposium on Circuits and Systems* (*ISCAS* 2004).

In the diagram, $V_{in}^+$ and $V_{in}^-$ denote the (differential, i.e., "positive" and "negative") inputs, while $V_{out}^+$ and $V_{out}^-$ denote the (differential) outputs. A load, not visible in the figures, may be connected to the output nodes $V_{out}^+$ and $V_{out}^-$.

The output common-mode voltage level $V_{CM}$ is sensed through a common-mode detector CMD and compared with a reference voltage, $V_{REF}$, e.g., in an error amplifier EA. The resulting error signal from the error amplifier EA is then fed to the biasing circuit $I_{BIAS}$ of the opamp in such a way as to implement a negative feedback.

The CMFB loop may be designed to ensure frequency compensation and circuit stability. This may increase the complexity of the overall design, its power consumption, and the amount of silicon area used. The frequency response of the (main) differential path may also be degraded in conventional CMFB schemes.

Figure 2:
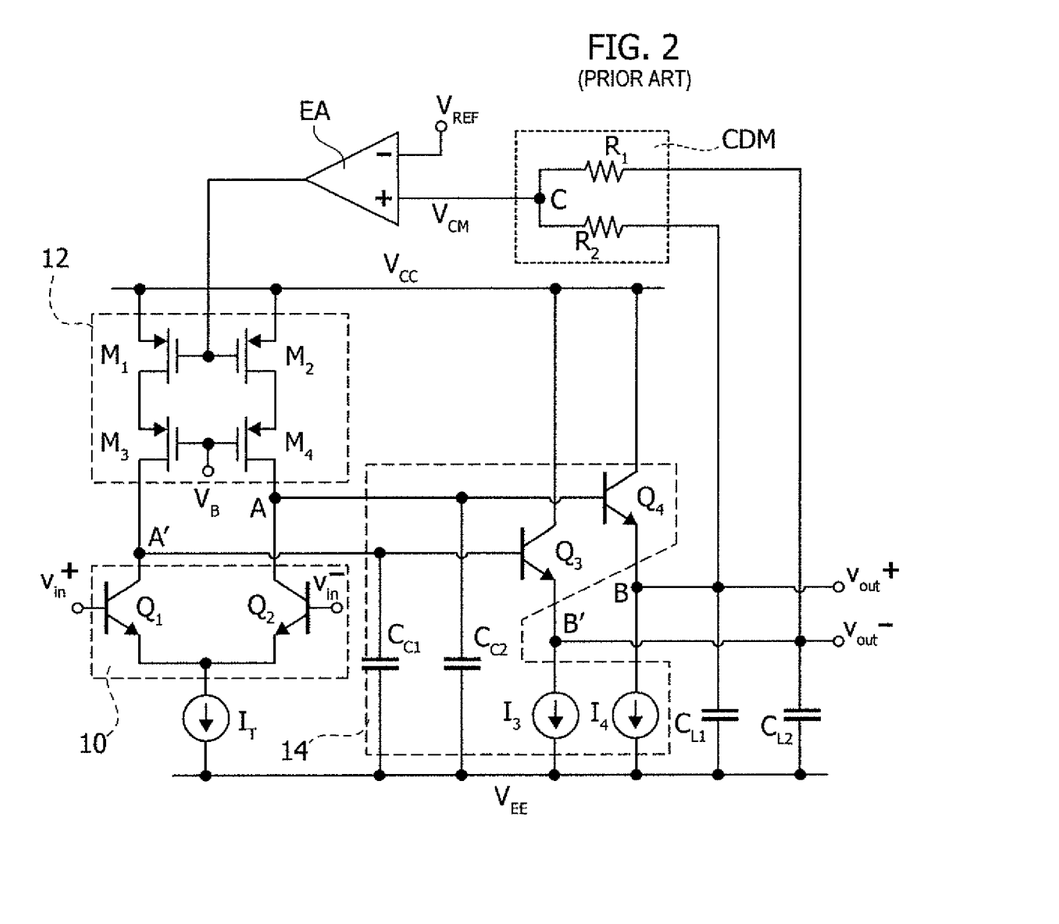
FIG. 2 is exemplary of a possible implementation of the basic diagram of FIG. 1.

For instance, a possible implementation of the circuit layout of FIG. 1 as illustrated in FIG. 2 may include a pair of resistors R1, R2 as an exemplary way of performing common-mode voltage detection (CMD). The diagram of FIG. 2 is exemplary of a wide bandwidth opamp, relying on a very simple topology in order to limit the number of frequency poles.

In addition to entities already introduced in connection with FIG. 1, the diagram of FIG. 2 shows a differential transconductor stage 10 with a high output impedance including a pair of (e.g., bipolar) transistors $Q_1$, $Q_2$ driven by the input voltage terminals $V_{in}^+$ and $V_{in}^-$. The differential transconductor stage 10 is coupled with a current mirror 12 including four transistors (e.g. MOSFETs) $M_1$, $M_2$, $M_3$, $M_4$.

The outputs A, A' from the differential transconductor stage 10 are applied to a high output impedance (e.g., non-inverting) gain stage 14 including two (e.g., bipolar) transistors $Q_3$, $Q_4$ in emitter-follower configuration.

References $V_{CC}$ and $V_{EE}$ denote voltage levels providing power feed to the circuit where $I_T$ denotes the tail current generator of the differential transconductor stage 10, while $I_3$ and $I_4$ denote the current intensities through the transistors $Q_3$ and $Q_4$.

In the possible implementation exemplified in FIG. 2, the frequency response of the differential gain may include two main contributions:

a dominant pole at the high-impedance node (A, A') as schematically represented by capacitances $C_{C1}$, $C_{C2}$ coupled to the bases of transistors $Q_3$ and $Q_4$, a secondary pole at the capacitive load (B, B') as schematically represented by capacitances $C_{L1}$, $C_{L2}$ coupled to the output voltage terminals $V_{out}^+$ and $V_{out}^-$.

Capacitors $C_{L1}$, $C_{L2}$ may negatively affect compensation since the phase margin becomes increasingly smaller as the values of these capacitances increases.

The frequency response may also include additional high-frequency poles which may degrade the CMFB phase margin (PM) compared to the differential one. These additional high-frequency poles may include, for example, a pole at the output of the resistive common-mode detector (parasitic capacitance at the node C of FIG. 2), as well as possible further poles within the error amplifier EA (this may be particularly true for low common mode voltages involving pnp- or MOS-based error amplifier topologies).

Compensation capacitors $C_{C1}$-$C_{C2}$ may provide sufficient PM to both the differential and CMFB loops. For a given minimum PM specification, the differential loop gain may be overcompensated (lower bandwidth, slower time response) to ensure the required PM to the CMFB loop.

Therefore, a fast CMFB loop may help in avoiding limitations on the differential frequency response.

E. Sánchez-Sinencio and J. Silva-Martínez (previously cited) disclose a loop architecture adapted to provide a faster CMFB response, where the functions of common-mode detection (voltage averaging) and comparison with the reference are performed in reverse order compared to the arrangement of FIG. 1. However, this approach involves using linear error amplifiers, because a possibly large differential signal is fed to their inputs in addition to the common-mode voltage component. Linear error amplifiers may, in turn, increase the overall current consumption and/or silicon area occupation.

U.S. Pat. No. 5,933,056 discloses a circuit aimed at improving the frequency response of the CMFB path by exploiting a "short" feedback path, which still suffers from the pole at the common-mode detector output.

This may be related to the fact that this arrangement actually relies on a voltage comparison, rather than on a current-based approach. It was noted that current-mode circuits may attain improved frequency responses, because they typically entail low-impedance nodes, i.e., high-frequency poles, compared to standard voltage-based topologies.

Using a current-mode approach may thus be helpful in implementing a fast CMFB loop, as exemplified, for example, in U.S. Pat. No. 6,362,682. In the circuit topology described therein, the feedback signal of the common-mode loop is the sum (average) of the currents flowing through a pair of resistors.

In high-gain feedback loops, the feedback signal tends to zero at steady-state, so that, under such conditions, the voltage drop across resistors tends to zero as well, and the output common-mode voltage may correctly track the voltage level at the reference input ($V_{REF}$). Implementations as exemplified, for example, in U.S. Pat. No. 6,362,682 may however suffer (e.g., under large-signal differential excitation) from a non-linear transistor behavior which may affect the accuracy of the output common-mode voltage control.

FIGS. 3 to 11 are exemplary of embodiments which may overcome the drawbacks outlined in the foregoing.

It will be appreciated that certain designations introduced in FIGS. 1 and 2 will be retained throughout FIGS. 3 to 11 without repeating a corresponding description. Again, a load (not visible in the figures) may be connected to the output nodes $V_{out}^+$ and $V_{out}^-$.

In the exemplary layout of FIG. 3, an output from a common-mode converter including resistors R1 and R2 (e.g., the point C where the two resistors R1 and R2 are connected) is fed to a comparator including a pair of (e.g., bipolar) transistors $Q_A$, $Q_B$ coupled with a cascode current mirror 12, 16 including transistors $M_1$ through $M_8$.

More specifically, in the exemplary embodiment of FIG. 3, the two transistors $Q_A$, $Q_B$ (e.g., n-p-n bipolar transistors) have their bases connected to each other, with the collector of transistor $Q_B$ shorted to its base. The output (point C) from the common-mode detector CMD is fed to the emitter of transistor $Q_A$, while the reference voltage $V_{REF}$ is applied to the emitter of transistor $Q_B$. The current intensities through the (emitter-collector) current paths of the transistors $Q_A$, $Q_B$ (which correspond to the current intensities through the branches $M_5$-$M_7$ and $M_6$-$M_8$ of the cascode current mirror 12, 16) are denoted $I_A$ and $I_B$.

The cascode current mirror 12, 16 (MOSFETs $M_1$ through $M_8$) may thus produce a current-based feedback path from the comparator including the transistor pair $Q_A$, $Q_B$ (i.e., from the connection point C of the two resistors R1, R2) to the differential input (transconductor) stage 10.

In one or more embodiments as exemplified in FIGS. 3 to 11, the designation "current-based" refers primarily to the nature of the signal sensed at the opamp differential output (e.g., at point C, via resistors R1, R2) in view of comparison with the reference $V_{REF}$ (e.g., via the transistor pair $Q_A$, $Q_B$).

That is, in one or more embodiments as exemplified herein the common-mode feedback loop may include a converter (e.g., resistors R1, R2) for converting the common-mode voltage level $V_{CM}$ sensed at the differential output terminals $V_{out}^+$, $V_{out}^-$ into a current signal fed to the comparator including, e.g., $Q_A$, $Q_B$.

In one or more embodiments as exemplified herein, the converter in question may thus include a pair of resistors R1, R2 each one interposed between a respective one of the differential output terminals (e.g., $V_{out}^+$ for resistor R1 and $V_{out}^-$ for resistor R2) of the differential output terminals and the comparator $Q_A$, $Q_B$.

In one or more embodiments as exemplified herein, the converter may include the common point C of the resistors R1, R2 coupled with the emitter of $Q_A$. In one or more embodiments as exemplified herein, the voltage at node C may in fact be set by $V_{REF}$.

In the exemplary embodiment of FIG. 3 the feedback connection includes:

a first line 18a from the gates of transistors $M_5$ and $M_6$ (with the drain of $M_5$ shorted to its gate) to the gates of transistors $M_1$ and $M_2$; and a second line 18b from the gates of transistors $M_7$ and $M_8$ (with the drain of $M_7$ shorted to its gate) to the gates of transistors $M_3$ and $M_4$.

In one or more embodiments, by way of schematic explanation, the cascode current mirror including transistors $M_1$ through $M_8$ may be regarded as including:

a portion $M_5$-$M_8$ of the cascode current mirror which is controlled by the comparator $Q_A$, $Q_B$ so as to produce a feedback loop error signal (e.g., lines 18a, 18b), and a portion $M_1$-$M_4$ of the cascode current mirror which controls the transconductor input stage 10 including, e.g., the transistor pair $Q_1$, $Q_2$ so that the feedback loop error signal is injected as a current feedback error signal into the transconductor input stage.

In one or more embodiments, the components of the exemplary circuit of FIG. 3 may be designed according to the following relationships:

$$(I_T/2I_A)=(W/L)_{1,2}/(W/L)_5=(W/L)_{3,4}/(W/L)_7$$

$$I_B/I_A=A_{eB}/A_{eA}=(W/L)_6/(W/L)_5=(W/L)_8/(W/L)_7$$

where $A_{eA}$ and $A_{eB}$ are the emitter areas of the bipolar transistors $Q_A$ and $Q_B$, respectively, whereas $(W/L)_i$ is the form factor of the i-th MOSFET $M_i$, for i=1 . . . 8.

According to the latter relationship above, the current densities through $Q_A$ and $Q_B$ may be made equal, which results in the base-emitter voltage $V_{BEA}$ for $Q_A$ being equal to the base-emitter voltage $V_{BEB}$ for $Q_B$ (base currents may be neglected here and in the following for simplicity).

Therefore, the voltage $V_C$ at the node C may be expressed as:

$$V_C=V_{REF}+V_{BEB}-V_{BEA}=V_{REF}$$

According to Kirchhoff's current law at node C:

$$I_{QA}=I_A-[(V_{out}^+-V_C)]/R_{1,2}-[(V_{out}^--V_C)]/R_{1,2}.$$

where $I_{QA}$ is the current flowing through transistor $Q_A$ (emitter and collector currents are assumed to be roughly equal since base currents are neglected).

By defining the output common-mode voltage $V_{CM}$ as $(V_{out}^++V_{out}^-)/2$, combining the three last relationships yields:

$$I_{QA}=I_A-2(V_{CM}-V_{REF})/R_{1,2}.$$

Because of the cascaded current mirror including transistors M1, M2, M3, M4, M5, and M7:

$$I_{M1}=I_{M2}=I_{QA}(W/L)_{1,2}/(W/L)_5=I_A(W/L)_{1,2}/(W/L)_5-(2/R_{1,2}).$$

$$[(W/L)_{1,2}/(W/L)_5](V_{CM}-V_{REF}).$$

where $I_{M1}$ and $I_{M2}$ are the currents flowing through transistor $M_1$ and $M_2$, respectively.

According to Kirchhoff's current law at nodes A and A':

$$I_T=I_{M1}+I_{M2}=2I_A(W/L)_{1,2}/(W/L)_5-(4/R_{1,2}).$$

$$[(W/L)_{1,2}/(W/L)_5](V_{CM}-V_{REF}).$$

which, in view of the first relationship in the foregoing, finally gives:

$$V_{CM}=V_{REF}.$$

This demonstrates that in one or more embodiments the output common-mode voltage $V_{CM}$ can successfully track the reference voltage $V_{REF}$.

By way of possible explanation, dynamically, if $V_{CM}$ increases, then the current injected into the node C through resistors R1 and R2 will increase as well, thus reducing $I_{QA}$. This will in turn decrease $I_{M1}$ and $I_{M2}$ (i.e., the currents flowing through the transistor $M_1$ and $M_2$ in the current mirror 12 coupled with the differential transconductor stage 10) which will result in a reduction of the voltage level at nodes A and A', i.e., the outputs A, A' from the differential transconductor stage 10 (high-impedance node). This will bring the opamp output voltage level down again, ultimately compensating the initial increase in $V_{CM}$. In a similar (but opposite) manner the feedback loop exemplified herein will be able to compensate a negative variation of the opamp output common-mode voltage.

One or more embodiments as exemplified herein may exhibit at least two advantages.

In the first place, the CMFB loop is based on a current-mode approach with the current flowing through resistors R1 and R2 determining the actual feedback signal. Current-mode circuits exhibit low-impedance nodes, which entails high-frequency poles in the frequency response, and hence a fast CMFB loop.

In the second place, the accuracy in the control of the common-mode voltage may be a function of the matching among transistors $Q_A$ and $Q_B$ (and their base-emitter voltages). These will not be exposed to large signal operating conditions, even if a large differential swing is delivered at the opamp output, which facilitates $V_{BE}$ matching, and hence reference tracking accuracy.

Figure 4:
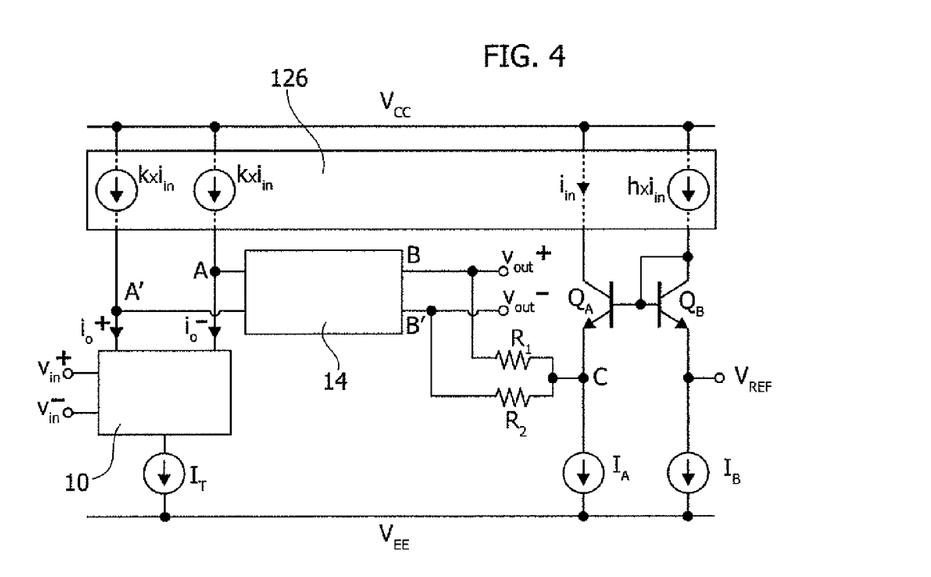
FIG. 4 is a generalized circuit diagram exemplary of embodiments of the invention.

In FIG. 4 the (differential transconductor) input stage 10 and the gain stage 14 are simply represented by blocks, thus highlighting the possibility of applying the principles underlying the embodiments exemplified in FIG. 2 to one or more embodiments where:

the differential transconductor stage 10 is implemented as any known type of differential transconductor preserving high output impedance level, i.e., not necessarily based on the differential couple $Q_1$–$Q_2$;

the gain stage 12 including loop compensation is implemented as any known type of (e.g., non-inverting) gain stage preserving high input impedance level not necessarily based on emitter followers $Q_3$–$Q_4$; and the cascode current mirror 12, 16 is implemented as any known type of multi-output current mirror 126, preserving high output impedance level, with current gain k towards the input branches and current gain h towards the $Q_B$ branch.

In one or more embodiments as exemplified in FIG. 4 where (by adopting the same symbols introduced in the foregoing):

$$I_T/2I_A=k$$

$$I_B/I_A=A_{eB}/A_{eA}=h$$

the opamp output common-mode voltage $V_C$ may track the reference voltage $V_{REF}$, exactly as in the case exemplified in FIG. 3.

In one or more embodiments, the current generator $I_T$ in FIG. 4 may be used to set the common-mode current for the input transconductor stage ($I_T=i_O^++i_O^-$), like the tail current of the input stage in FIG. 2.

It will be appreciated that, throughout the embodiments exemplified herein, this current generator may also be referred to $V_{CC}$ (instead of $V_{EE}$) as in the case of a folded cascade input differential transconductor.

Figure 5:
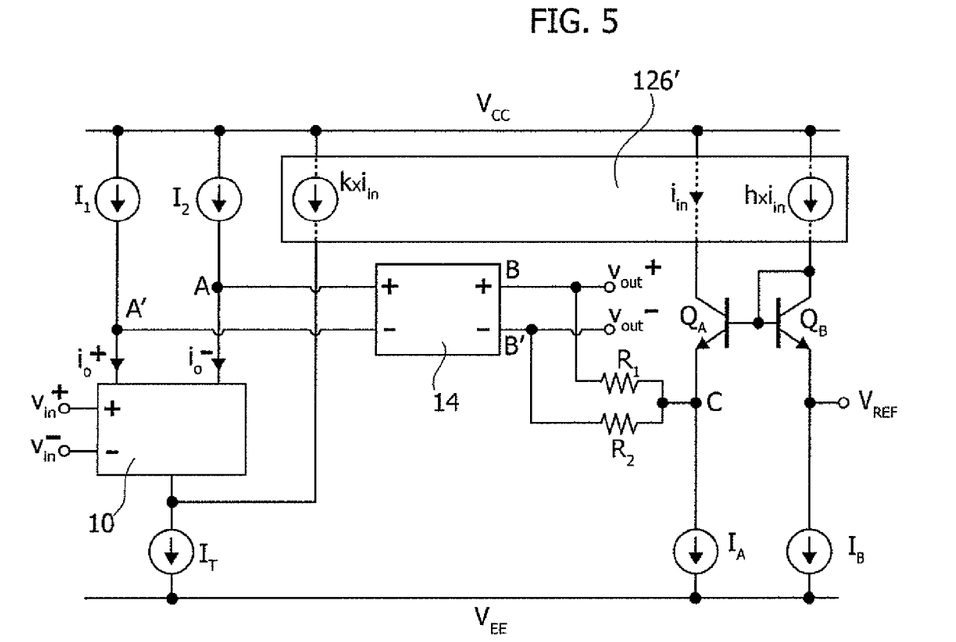
FIGS. 5 to 7 are further circuit diagrams exemplary of embodiments of the invention.

The circuit diagram of FIG. 5 is exemplary of one or more embodiments where the output of the multi-output current mirror, here designated 126', instead of being injected at nodes A-A' is injected at the tail node of the input differential transconductor 10. This may be advantageous in those embodiments with a reduced supply headroom, with the CMFB loop functionality maintained.

In one or more embodiments as exemplified in FIG. 5 where (by again adopting the same symbols introduced in the foregoing):

$$I_T=kI_A+2I_{1,2}$$

$$I_B/I_A=A_{eB}/A_{eA}=h$$

the opamp output common-mode voltage $V_C$ will again track the reference voltage $V_{REF}$.

Figure 6:
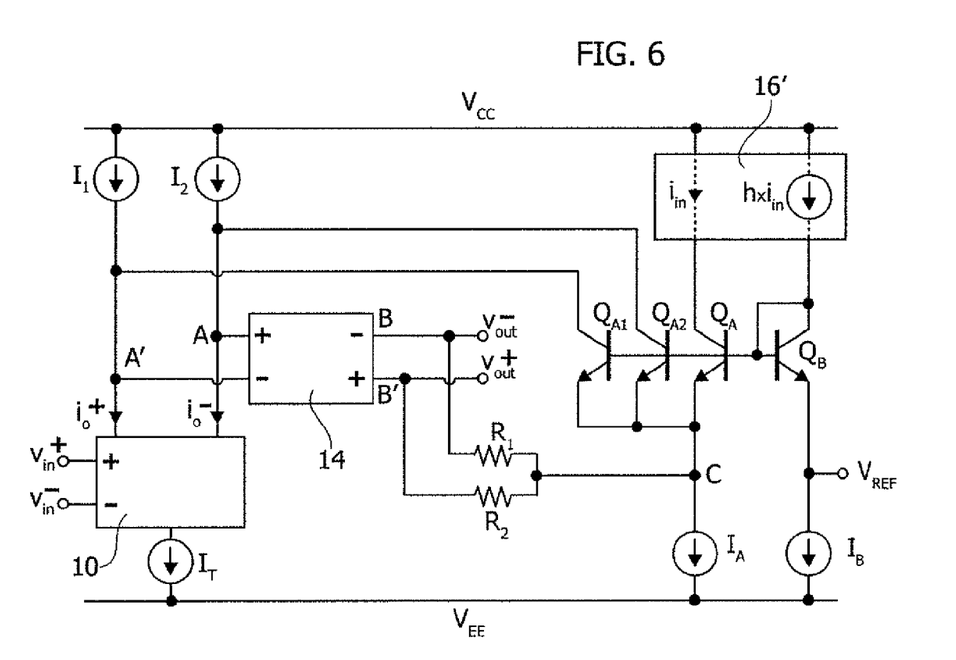

The circuit diagram of FIG. 6 is exemplary of one or more embodiments where the gain stage 14 includes an inverting stage instead of a non-inverting stage.

In such embodiments, the CMFB loop topology may be modified in order to take into account the resulting signal inversion, thus maintaining a negative loop gain.

For instance, a current mirror 16' may include two branches associated with the transistors $Q_A$ and $Q_B$ through with current intensities $i_{in}$ and $h \cdot i_{in}$, respectively, flow.

The common-mode feedback path may include further transistors $Q_{A1}$, $Q_{A2}$ which mirror the transistor $Q_A$ and inject respective currents into the current paths $I_1$ and $I_2$ to the output nodes A-A' of the differential transconductor 10.

In one or more embodiments as exemplified in FIG. 6 where (with the same symbols introduced in the foregoing):

$$A_{eB}/A_{eA}=h$$

$$I_B/I_A=A_{eB}/(A_{eA}+2A_{eA1,2})$$

$$I_{1,2}=I_T/2+A_{eA1,2}I_A/(A_{eA}+2A_{eA1,2})$$

the opamp output common-mode voltage $V_C$ will track the reference voltage $V_{REF}$.

Figure 7:
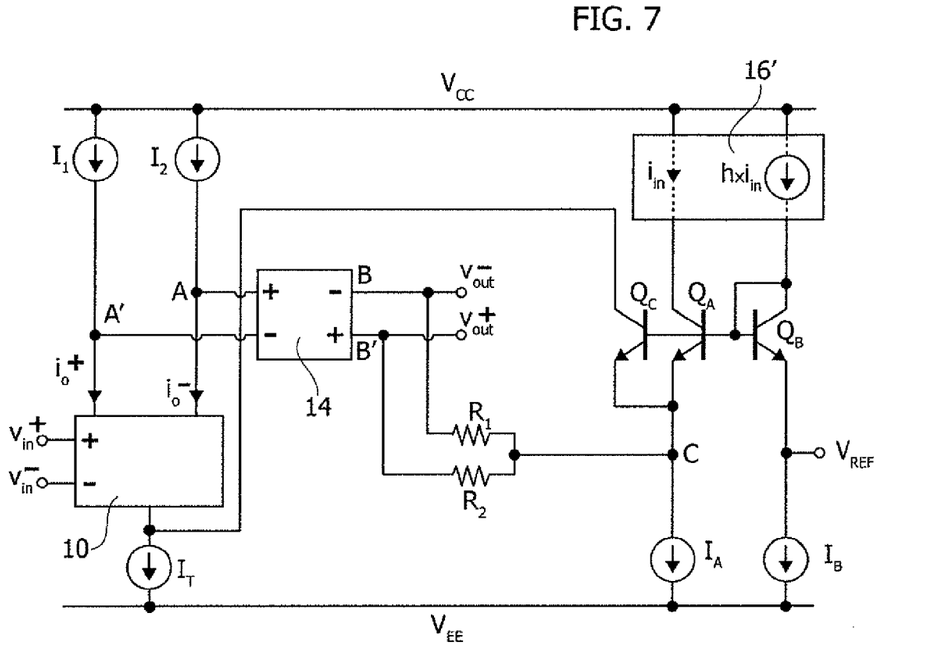

The circuit diagram of FIG. 7 is exemplary of one or more embodiments where, as in the case of FIG. 6, the gain stage 14 may again include an inverting stage instead of a non-inverting stage.

In one or more embodiments as exemplified in FIG. 7, the common-mode feedback path includes at least one further transistor $Q_C$ which mirrors the transistor $Q_A$ and injects a respective feedback current signal (as in the case of those embodiments as exemplified FIG. 5) at the tail node of the input differential transconductor 10 rather than at its output nodes A-A'.

In one or more embodiments as exemplified in FIG. 7 where (with the same symbols introduced in the foregoing and with $A_{eC}$ denotes the emitter area of transistor $Q_C$):

$$A_{eB}/A_{eA}=h$$

$$I_B/I_A=A_{eB}/(A_{eA}+A_{eC})$$

$$2I_{1,2}=I_T+A_{eC}I_A/(A_{eA}+A_{eC})$$

the opamp output common-mode voltage $V_C$ will track the reference voltage $V_{REF}$.

Those of skill in the art will appreciate that circuit topologies as exemplified in the figures may be implemented, wholly or partly, in a complementary configuration, e.g., by using p-n-p transistors in the place of n-p-n transistors and viceversa or pMOS transistors instead of nMOS and viceversa. Case-specific bias level compatibility requirements may dictate the choice of the configuration. Similarly, the inverting or non-inverting nature of the gain stage 14 may dictate, e.g., coupling of transistors $Q_{A1}$, $Q_{A2}$, $Q_C$ to $Q_B$ in the place of $Q_A$ as exemplified herein.

FIGS. 8 to 11 are exemplary of certain features which may be included in any of the circuit topologies exemplified in the foregoing; that is, while shown as possibly applied to the circuit topology of FIG. 3, these features can be applied to any of the other circuit topologies exemplified herein. Also, while shown separately for the sake of simplicity, the features in FIGS. 8 to 11 may be combined with one another and thus co-exist in one or more embodiments.

Figure 8:
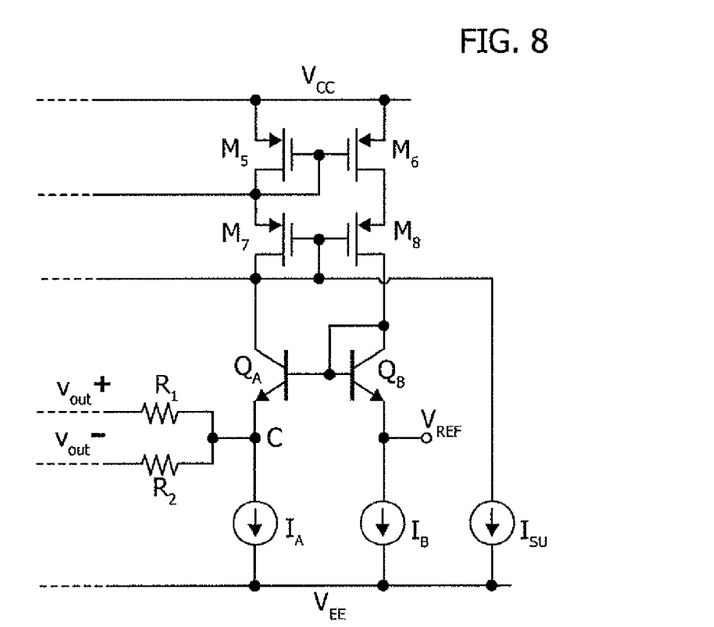
FIGS. 8 to 11 are partial circuit diagrams exemplary of features adapted to be included in embodiments of the invention.

For instance, FIG. 8 is exemplary of the possibility of adding a (small) start-up current $I_{SU}$ between the current mirror 16 and $V_{EE}$ in order to improve turn-on performance of the circuit, e.g., like in a conventional proportional to absolute temperature (PTAT) generator, without appreciably affecting current consumption.

Figure 9:
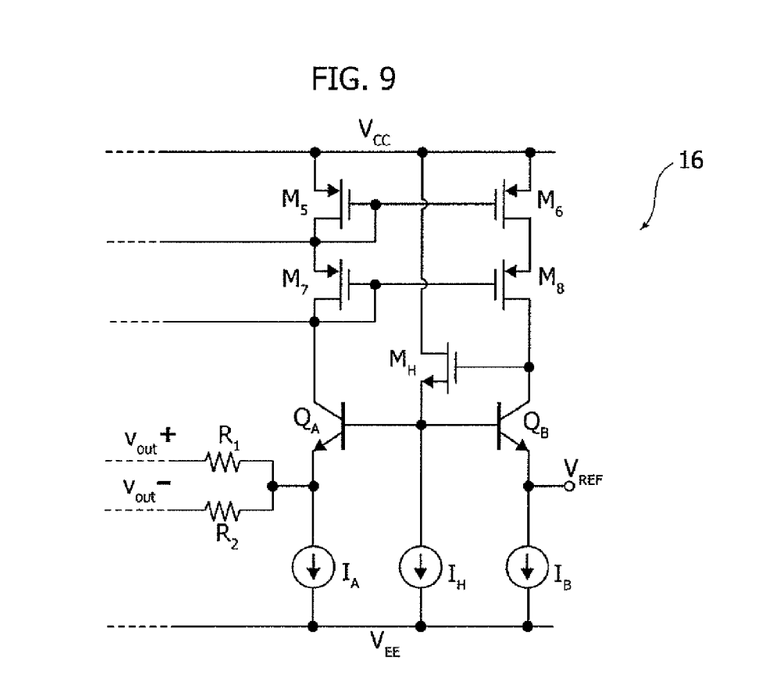

FIG. 9 is exemplary of the possibility of adding a beta helper $M_H$, $I_H$ to the transistors $Q_A$-$Q_B$ to improve the matching of their base-emitter voltages.

Figure 10:
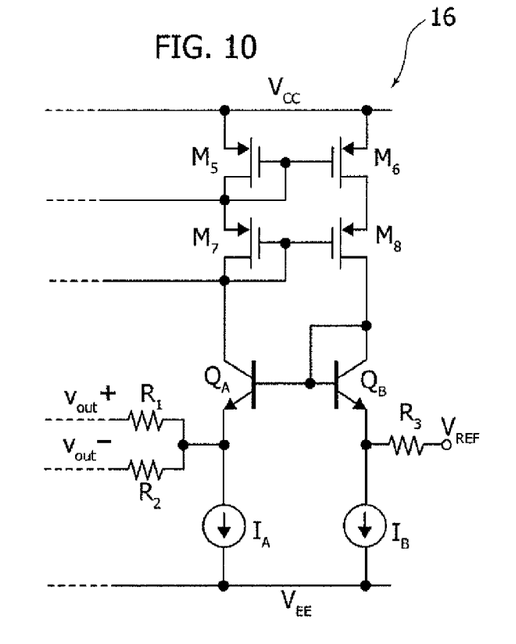
Figure 11:
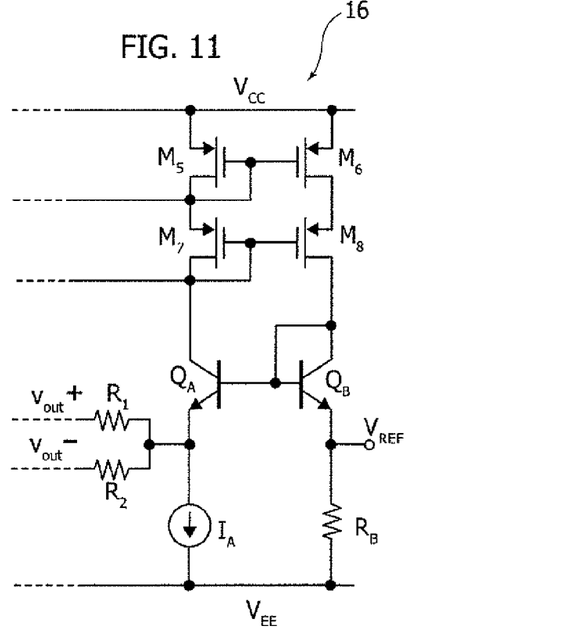

FIG. 10 is exemplary of the possibility of adding a resistor R3 in series with the input line to the error amplifier EA to which the reference voltage $V_{REF}$ is applied.

This may improve the accuracy of the common-mode tracking, e.g. by allowing for a voltage drop across resistors R1 and R2 because of a non-zero residual current flowing through them. This may be a (very) small voltage drop, which has been neglected in the previous analysis for the sake of simplicity, and becomes lower for higher CMFB loop gain values.

That source of error may be compensated by adding a resistor R3 such that:

$$R3=(A_{eA}/A_{eB})(R_{1,2}/2)$$

Finally, FIG. 10 is exemplary of the possibility of replacing the current generator $I_B$ with a resistor $R_B$, so that the reference input $V_{REF}$ may be allowed to float, e.g. in order that the node $V_{REF}$ may be self-biased at a default voltage level:

$$V_{REF(default)}=(A_{eA}/A_{eB})R_B I_A.$$

with the opamp output common-mode voltage set accordingly.

Of course, without prejudice to underlying principles of the embodiments, the details of construction and the embodiments may vary, even significantly, with respect to what is illustrated herein purely by way of non-limiting example, without thereby departing from the extent of protection. The extent of protection is defined by the annexed claims.

The invention claimed is:

1. A common-mode feedback circuit comprising:
a transconductor input stage having differential input terminals;
a frequency-compensated gain stage coupled to said transconductor input stage and having differential output terminals;
a common-mode feedback loop including a comparator configured to produce a feedback error signal for said transconductor input stage by comparing a common-mode sensing signal indicative of a common-mode voltage level sensed at said differential output terminals with a reference;
said common-mode feedback loop including a converter configured to convert the common-mode voltage level sensed at said differential output terminals into a current signal coupled to said comparator, said converter comprising a pair of common-mode detector resistors coupled to said differential output terminals, and said comparator comprising a current amplifier.

2. The common-mode feedback circuit of claim 1, further comprising a cascode current mirror with a first portion coupled with said comparator and a second portion coupled with said transconductor input stage.

3. The common-mode feedback circuit of claim 1, further comprising a multi-output current mirror having respective gains towards said transconductor input stage and said comparator.

4. The common-mode feedback circuit of claim 1, wherein said transconductor input stage comprises output nodes coupled to said frequency-compensated gain stage and the feedback error signal of said common-mode feedback loop is injected into one of said output nodes of said transconductor input stage, and a tail current generator of said transconductor input stage.

5. The common-mode feedback circuit of claim 1, wherein said comparator comprises a transistor pair sensitive to said reference and said current signal from said converter.

6. The common-mode feedback circuit of claim 5, wherein said common-mode feedback loop comprises at least one further transistor coupled with a transistor of said transistor pair to generate said feedback error signal for said transconductor input stage.

7. The common-mode feedback circuit of claim 6, further comprising at least one of:
   a start-up current generator coupled with a current generator circuit at said comparator;
   a beta helper coupled to a differential transistor pair in said comparator; and
   at least one of a first error-compensating resistor and a second self-bias resistor coupled with an input terminal of said comparator for said reference.

8. An integrated circuit comprising:
   a transconductor input stage;
   a frequency-compensated gain stage coupled to said transconductor input stage and having differential output terminals; and
   a common-mode feedback loop including a comparator configured to produce a feedback error signal for said transconductor input stage by comparing a common-mode sensing signal indicative of a common-mode voltage level sensed at said differential output terminals with a reference;
   said common-mode feedback loop including a converter configured to convert a common-mode voltage sensing signal into a current signal coupled to said comparator, said converter comprising a pair of common-mode detector resistors coupled to said differential output terminals, and said comparator comprising a current amplifier.

9. The integrated circuit of claim 8, further comprising a cascode current mirror with a first portion coupled with said comparator and a second portion coupled with said transconductor input stage.

10. The integrated circuit of claim 8, further comprising a multi-output current mirror having respective gains towards said transconductor input stage and said comparator.

11. A method of providing feedback in a common-mode feedback circuit comprising a transconductor input stage having differential input terminals, a frequency-compensated gain stage coupled to said transconductor input stage and having differential output terminals, a converter comprising a pair of common-mode detector resistors coupled to said differential output terminals, and a comparator comprising a current amplifier, the method comprising:
   producing a common-mode feedback error signal by a comparison of a common-mode sensing signal indicative of a common-mode voltage at said differential output terminals with a reference; and
   converting said common-mode sensing signal into a current signal for said comparison.

12. The method of claim 11, further comprising a cascode current mirror with a first portion coupled with said comparator and a second portion coupled with said transconductor input stage.

13. The method of claim 11, further comprising a multi-output current mirror having respective gains towards said transconductor input stage and said comparator.

14. An integrated circuit comprising:
   a transconductor input stage having differential input terminals;
   a frequency-compensated gain stage coupled to said transconductor input stage and having differential output terminals;
   a common-mode feedback loop including a comparator configured to produce a feedback error signal for said transconductor input stage; and
   a multi-output current mirror comprising a first portion coupled with said comparator and a second portion coupled with said transconductor input stage;
   said common-mode feedback loop including a converter configured to convert a common-mode voltage level sensed at said differential output terminals into a current signal coupled to said comparator.

15. The integrated circuit of claim 14, wherein the multi-output current mirror has respective gains towards said transconductor input stage and said comparator.

16. The integrated circuit of claim 14, wherein said transconductor input stage comprises output nodes coupled to said frequency-compensated gain stage and the feedback error signal of said common-mode feedback loop is injected into one of said output nodes of said transconductor input stage, and a tail current generator of said transconductor input stage.

* * * * *